United States Patent
Wei et al.

(10) Patent No.: US 9,379,151 B1
(45) Date of Patent: Jun. 28, 2016

(54) IMAGE SENSOR DEVICE WITH WHITE PIXEL IMPROVEMENT

(71) Applicant: TAIWAN SEMICONDUCTOR MANUFACTURING CO., LTD., Hsinchu (TW)

(72) Inventors: Chia-Yu Wei, Tainan (TW); Yin-Chen Chen, Tainan (TW); Yen-Liang Lin, Tainan (TW); Yung-Lung Hsu, Tainan (TW); Hsin-Chi Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/600,949

(22) Filed: Jan. 20, 2015

(51) Int. Cl.
*H01L 27/148* (2006.01)
*H01L 27/146* (2006.01)

(52) U.S. Cl.
CPC ........ *H01L 27/14614* (2013.01); *H01L 27/148* (2013.01); *H01L 27/14638* (2013.01); *H01L 27/14643* (2013.01)

(58) Field of Classification Search
None
See application file for complete search history.

(56) References Cited

U.S. PATENT DOCUMENTS

| | | | |
|---|---|---|---|
| 6,982,186 B2 * | 1/2006 | Jeon | H01L 27/14689 257/E27.133 |
| 7,436,011 B2 * | 10/2008 | Chen | H01L 27/14603 257/292 |
| 2011/0133260 A1 * | 6/2011 | Ko | H01L 27/14609 257/292 |

* cited by examiner

*Primary Examiner* — Benjamin Sandvik
*Assistant Examiner* — Herve Assouman
(74) *Attorney, Agent, or Firm* — Maschoff Brennan

(57) ABSTRACT

An image sensor device is provided, and includes pixel units. Each of the pixel units includes a light sensing element, a first transistor and a second transistor. The first transistor is coupled to the light sensing element. The second transistor is coupled to the light sensing element and the first transistor. The first transistor includes a first gate structure having a first width, and the second transistor includes a second gate structure having a second width, in which a distance between the first gate structure and the second gate structure is substantially greater than the first width and the second width.

16 Claims, 9 Drawing Sheets

IMAGE SENSOR DEVICE WITH WHITE PIXEL IMPROVEMENT

BACKGROUND

An image sensor device, such as a complementary metal-oxide semiconductor (CMOS) image sensor (CIS), has been widely used in various electronic products such as a digital camera, a smart phone, a tablet, a car video recorder and other applications. Due to miniaturization trend, the electronic components in the image sensor device and the distances between the electronic components in each pixel unit of the image sensor device become smaller and smaller, and thus high pixel resolution is achieved. However, over-concentration of the components induces defects like silicon dislocations and/or crystal defects that result in leakage currents, which in turn contributes to white pixel problems, or more seriously to symptoms of white spot in the image sensor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
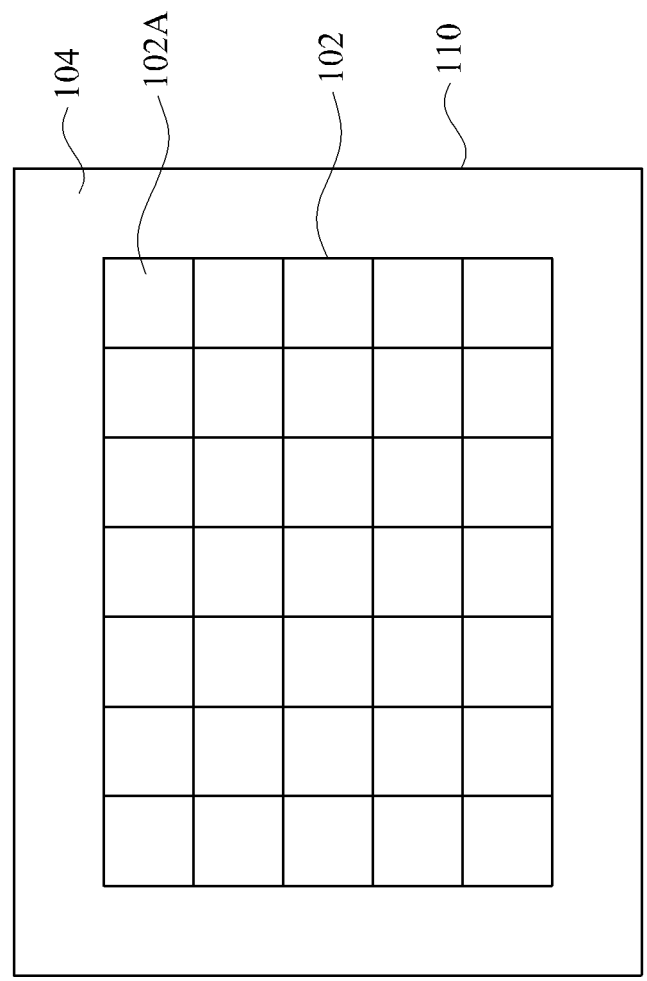
FIG. 1 illustrates a schematic diagram of an image sensor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

Terms concerning electrical communications, such as "coupled," refer to a relationship wherein nodes communicate with one another either directly or indirectly through intervening structures, unless otherwise stated or necessary to the operation described.

Terms used herein are only used to describe the specific embodiments, which are not used to limit the claims appended herewith. For example, unless limited otherwise, the term "a", "an" or "the" of the single form may also represent the plural form.

The terms such as "first," "second," "third" and "fourth" are used for describing various elements, though such terms are only used for distinguishing one element from another element. Therefore, the first element may also be referred to as the second element without departing from the spirit of the claimed subject matter, and the others are deduced by analogy.

Embodiments of the present disclosure are directed to providing an image sensor device and a semiconductor structure for reducing defects such as silicon dislocations and/or crystal defects. In the semiconductor structure, a distance between gate structures is greater than widths of the gate structures, such that unbalanced mechanical stress in fabricating processes can be reduced. Therefore, leakage currents due to defects such as silicon dislocations and/or crystal defects can be prevented. The image sensor device with such semiconductor structure can avoid which pixels induced by leakage currents.

Referring to FIG. 1, FIG. 1 illustrates a schematic diagram of an image sensor device 100 in accordance with some embodiments of the present disclosure. The image sensor device 100 is a BSI (back-side illuminated) or FSI (front-side illuminated) complementary metal oxide semiconductor (CMOS) image sensor, which includes a semiconductor substrate 110 and circuits (not shown) formed on the semiconductor substrate 110. The semiconductor substrate 110 has a pixel area 102 and a logic area 104 surrounding the pixel area 102. The pixel area 102 includes pixel units 102A for generating electric charges responsive to light incident thereon. Some circuits are located in the pixel area 102 for transferring electric charges generated from the pixel units 102A to the logic area 104. Other circuits are located in the logic area 104 for processing output signals from the pixel area 102. The semiconductor substrate 110 includes, but is not limited to, a semiconductor wafer, a silicon-on-insulator (SOI) substrate or an epitaxial substrate. In some embodiments, the semiconductor substrate 110 includes an elementary semiconductor such as silicon, germanium or diamond. In various embodiments, the semiconductor substrate 110 includes a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide or gallium indium phosphide.

In the present disclosure, the number of the pixel units 102A may be one million, for example. However, the number of the pixel units in one image sensor device may vary in accordance with various applications.

In addition, each of the pixel units 102A may include a color filter (not shown) and a microlens (not shown) for filtering and directing the incident light. The features of the color filter and the microlens are well known to those skilled in the art, and thus are not described in detail herein.

Figure 2:
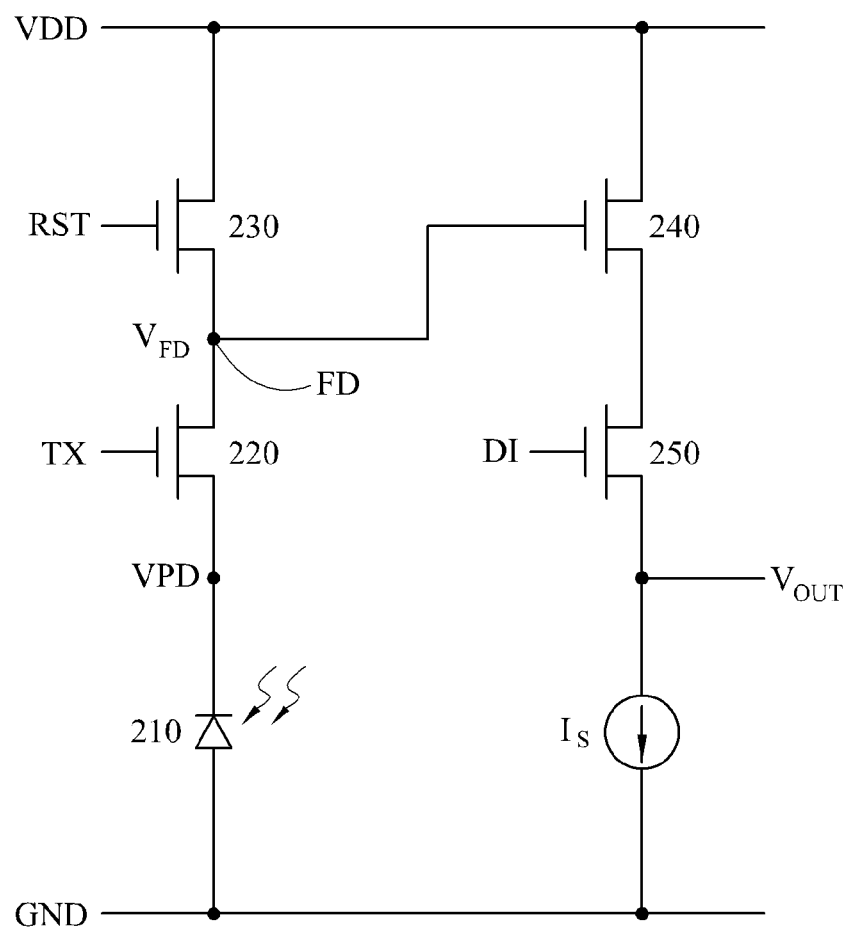
FIG. 2 illustrates a circuit diagram of a pixel circuit of each pixel unit shown in FIG. 1 in accordance with some embodiments of the present disclosure.

Referring to FIG. 2, FIG. 2 illustrates a circuit diagram of a pixel circuit 200 of each pixel unit 102A shown in FIG. 1. In FIG. 2, the pixel circuit 200 includes a light sensing element 210, a transfer transistor 220, a reset transistor 230, a source follower transistor 240, a row select transistor 250 and a current source $I_S$. The light sensing element 210 is adapted to perform photoelectric conversion for converting the incident light into electric charges and provides a photon diffusion voltage VPD to the transfer transistor 220. The anode of the light sensing element 210 is coupled to a ground potential GND, and the cathode of the light sensing element 210 is coupled to the source of the transfer transistor 220.

In some embodiments, the light sensing element 210 is a photodiode, a pinned photodiode, a partially pinned photodiode, a photogate or a photo transistor.

The transfer transistor 220 is adapted to transfer the photon-induced electric charges in accordance with a transfer voltage TX. The source of the transfer transistor 220 is coupled to the light sensing element 210. The gate of the transfer transistor 220 is configured to receive the transfer voltage TX. The drain of the transfer transistor 220 is coupled to the source of the reset transistor 230 and the gate of the source follower transistor 240, and acts as a floating diffusion region FD that accumulates the electric charges generated in the light sensing element 210.

The reset transistor 230 is adapted to reset the light sensing element 210 by resetting a floating diffusion voltage $V_{FD}$ in the floating diffusion region FD in accordance with a reset voltage RST. The source of the reset transistor 230 is coupled to the drain of the transfer transistor 220 and the gate of the source follower transistor 240. The gate of the reset transistor 230 is configured to receive the reset voltage RST. The drain of the reset transistor 230 is configured to receive a voltage source VDD.

The source follower transistor 240 is adapted to allow the photon diffusion voltage VPD to be observed without removing the accumulated electric charge in accordance with the floating diffusion voltage $V_{FD}$. The source of the source follower transistor 240 is coupled to the drain of the row select transistor 250. The gate of the source follower transistor 240 is coupled to the drain of the transfer transistor 220 and the source of the reset transistor 230. The drain of the source follower transistor 240 is configured to receive the voltage source VDD.

The row select transistor 250 is adapted to allow a single row of pixel units in an array, such as illustrated in the array of FIG. 1, to be read in accordance with a row select voltage DI. The source of the row select transistor 250 is coupled to the current source $I_S$ and determines an output voltage $V_{OUT}$. The gate of the row select transistor 250 is configured to receive the row select voltage DI. The drain of the row select transistor 250 is coupled to the source of the source follower transistor 240.

Figure 3:
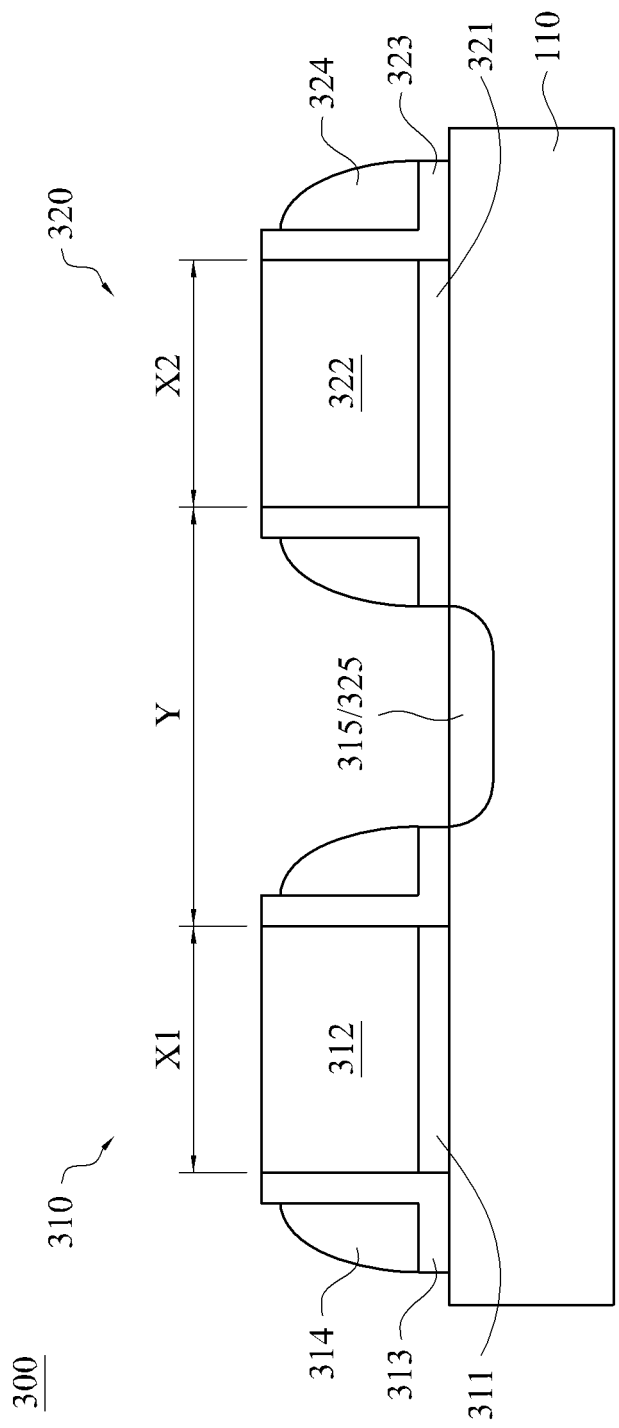
FIG. 3 illustrates a schematic cross-sectional view of the source follower transistor and a row select transistor shown in FIG. 2.

Referring to FIG. 3, FIG. 3 illustrates a schematic cross-sectional view of a semiconductor structure 300 in accordance with some embodiments of the present disclosure. The semiconductor structure 300 is a part of the pixel circuit 200 shown in FIG. 2. In FIG. 3, two transistors 310 and 320 are illustrated and, in some embodiments, the transistors 310 and 320 are the source follower transistor 240 and the row select transistor 250, respectively. As shown in FIG. 3, the transistors 310 and 320 are disposed on the semiconductor substrate 110. The transistor 310 includes a gate dielectric 311, a gate structure 312, a dielectric layer 313, a spacer 314 and a source/drain region 315. The gate dielectric 311 and the gate structure 312 are sequentially disposed on the semiconductor substrate 110. The gate dielectric 311 may include a dielectric material such as, but not limited to, silicon oxide, silicon nitride, silicon oxynitride, silicon oxycarbide, high-k dielectrics and/or combinations thereof. In some embodiment, the gate dielectric 311 is disposed with a thickness between about 5 Angstroms to about 150 Angstroms. The gate structure 312 may include a material such as, but not limited to, polysilicon, heavily/lightly doped polysilicon, undoped polysilicon, amorphous silicon, silicon carbide, silicon-germanium, metal, metal oxide, metal alloy, single crystalline silicon or suicide. In some embodiments, the gate structure 312 includes polysilicon with a thickness between about 800 Angstroms to about 2000 Angstroms. The dielectric layer 313 is formed on sidewalls of the gate dielectric 311 and the gate structure 312. The dielectric layer 313 may include a material such as, but not limited to, oxide, nitride, oxinitride and/or combinations thereof. The spacer 314 is formed on outer sidewalls of the dielectric layer 313. The spacer 314 may include a material such as, but not limited to, oxide, nitride, oxynitride and/or combinations thereof. The source/drain region 315 is formed in the semiconductor substrate 110 and adjacent to the dielectric layer 313 by using an implantation process. The conductivity type of the source/drain region 315 may be either P-typed or N-typed.

Similarly, the transistor 320 includes a gate dielectric 321, a gate structure 322, a dielectric layer 323, a spacer 324 and a source/drain region 325. The gate dielectric 321 and the gate structure 322 are sequentially disposed on the semiconductor substrate 110. The gate dielectric 321 may include a dielectric material such as, but not limited to, silicon oxide, silicon nitride, silicon oxynitride, silicon oxycarbide, high-k dielectrics and/or combinations thereof. In some embodiment, the gate dielectric 321 is disposed with a thickness between about 5 Angstroms to about 150 Angstroms. The gate structure 322 may include a material such as, but not limited to, heavily/lightly doped polysilicon, undoped polysilicon, amorphous silicon, silicon carbide or silicon-germanium. In some embodiments, the gate structure 322 includes polysilicon with a thickness between about 800 Angstroms to about 2000 Angstroms. The dielectric layer 323 is formed on sidewalls of the gate dielectric 321 and the gate structure 322. The dielectric layer 323 may include a material such as, but not limited to, oxide, nitride, oxinitride and/or combinations thereof. The spacer 324 is formed on outer sidewalls of the dielectric layer 323. The spacer 324 may include a material such as, but not limited to, oxide, nitride, oxynitride and/or combinations thereof. The source/drain region 325 is formed in the semiconductor substrate 110 and adjacent to the dielectric layer 323 by using an implantation process. The conductivity type of the source/drain region 325 is the same as that of the source/drain region 315. The source/drain regions 315 and 325 may be viewed as a combined source/drain region 315/325.

The gate structures 312 and 322 have widths X1 and X2 respectively. The widths X1 and X2 may be determined in accordance with various design criteria. In the present disclosure, a distance Y between the gate structures 312 and 322 is greater than the widths X1 and X2. For example, if the width X1 of the gate structure 312 and the width X2 of the gate structure 322 are both 0.14 micrometers, the distance Y between the gate structures 312 and 322 is greater than 0.14 micrometers.

The transistor 310 and 320 are not limited to the source follower transistor 240 and the row select transistor 250. In other words, the semiconductor structure 300 may alternatively include a combination of the transfer transistor 220 and the reset transistor 230, a combination of the transfer transistor 220 and the source follower transistor 240, a combination of the transfer transistor 220 and the row select transistor 240, a combination of the reset transistor 230 and the source follower transistor 240 or a combination of the reset transistor 230 and the row select transistor 250.

Referring to FIGS. 4A-4D, FIGS. 4A-4D illustrate cross-sectional diagrams for fabricating the semiconductor structure 300 shown in FIG. 3 in accordance with some embodiments of the present disclosure.

Figure 4A:
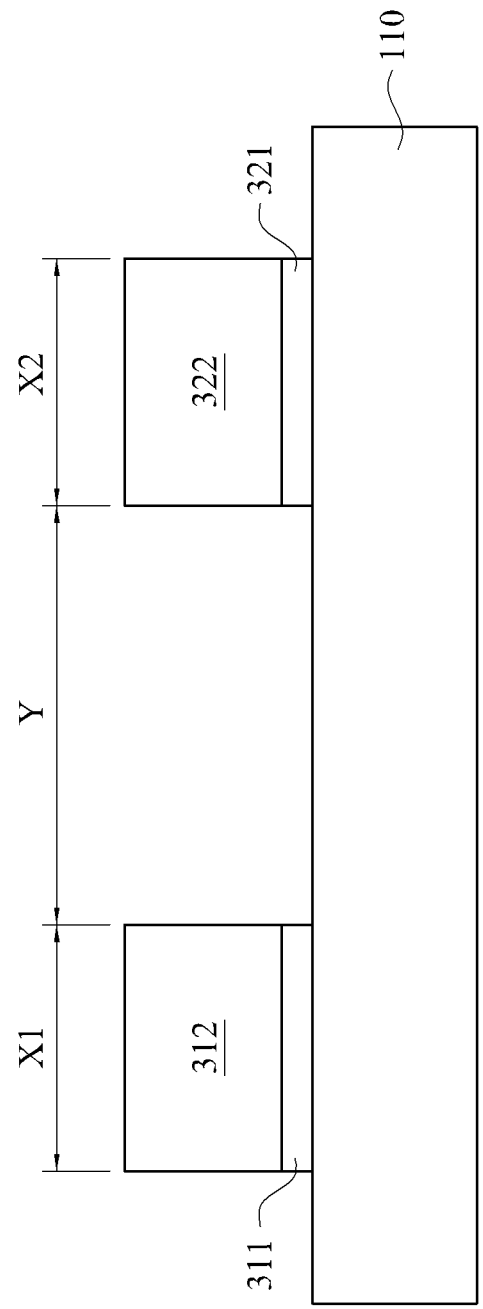
FIGS. 4A-4D illustrate cross-sectional diagrams for fabricating the semiconductor structure shown in FIG. 3 in accordance with some embodiments of the present disclosure.

In FIG. 4A, a semiconductor substrate 110 is provided. The semiconductor substrate 110 may be formed including, but not limited to, a semiconductor wafer, a silicon-on-insulator (SOI) substrate or an epitaxial substrate. In some embodiments, the semiconductor substrate 110 is formed further including an elementary semiconductor such as silicon, germanium or diamond. In various embodiments, the semiconductor substrate 110 is formed further including a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide or gallium indium phosphide. Then, gate dielectrics 311 and 321 are formed on the semiconductor substrate 110, and gate structures 312 and 322 are respectively formed on the gate dielectrics 311 and 321, respectively. For forming the gate dielectrics 311 and 321 and the gate structures 312 and 322, a first dielectric layer (not shown) and a conductive layer (not shown) are sequentially formed on the semiconductor substrate 110, and then the first dielectric layer (not shown) and the conductive layer (not shown) are patterned, such that the gate dielectrics 311 and 321 and the gate structures 312 and 322 are formed.

The first dielectric layer (not shown) may be formed including a dielectric material such as, but not limited to, silicon oxide, silicon nitride, silicon oxynitride, silicon oxycarbide, high-k dielectrics and/or combinations thereof, and may be formed by using a deposition process such as chemical vapor deposition (CVD), physical vapor deposition (PVD), atomic layer deposition (ALD), combinations thereof, or the like.

The conductive layer (not shown) may be formed including a material such as, but not limited to, polysilicon, heavily/lightly doped polysilicon, undoped polysilicon, amorphous silicon, silicon carbide, silicon-germanium, metal, metal oxide, metal alloy, single crystalline silicon or suicide, and may be deposited by using a deposition process such as CVD, PVD, low pressure CVD (LPCVD), combinations thereof, or the like.

The patterning may be accomplished by performing a photolithography process and an etching process. In the photolithography process, a photomask is formed on the conductive layer to define areas where the gate dielectrics 311 and 321 and the gate structures 312 and 322. The photolithography process may be performed by using a process such as spin-on coating, CVD, PECVD, high density plasma CVD (HD-PCVD), PVD, ALD, combinations thereof, or the like. After the photolithography process, the etching process is performed to remove unwanted parts of the first dielectric layer (not shown) and the conductive layer (not shown) uncovered by the photomask. The etching process may include wet etching, dry etching, reactive ion etching and/or chemical etching.

After the etching process, the gate dielectrics 311 and 321 and the gate structures 312 and 322 are formed, where a distance Y between the gate structures 312 and 322 is greater than a width X1 of the gate structure 312 and a width X2 of the gate structure 322.

Figure 4B:
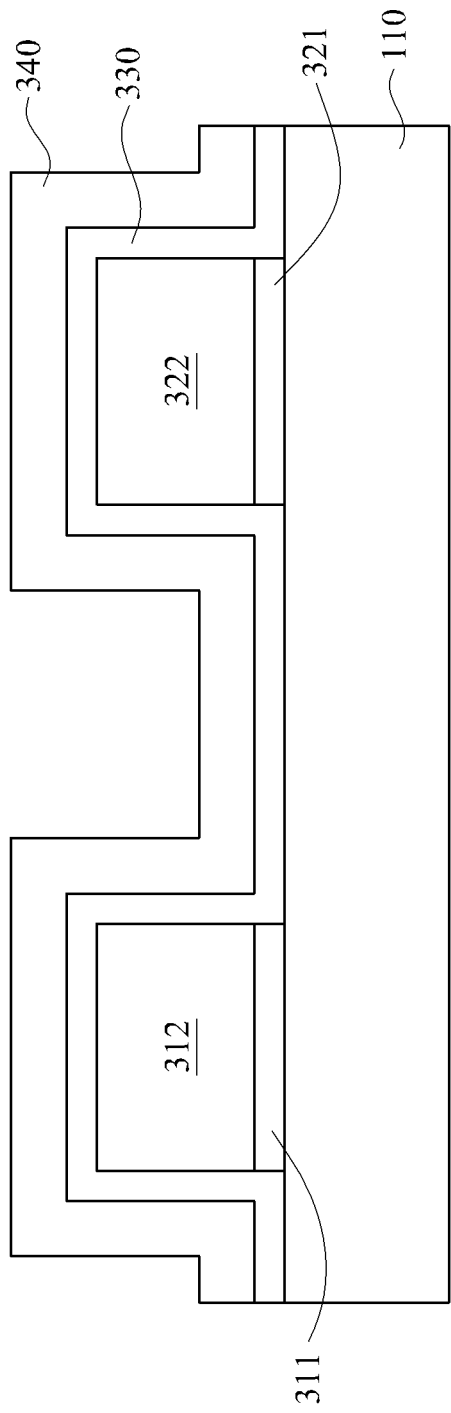

In FIG. 4B, a second dielectric layer 330 and a third dielectric layer 340 are sequentially formed on the semiconductor substrate 110 and the gate structures 312 and 322. The second dielectric layer 330 is formed conformally to cover the exposed surfaces of the semiconductor substrate 110 and the gate structures 312 and 322. The second dielectric layer 330 may be formed including a dielectric material such as, but not limited to, silicon oxide, silicon nitride, silicon oxynitride, silicon oxycarbide, high-k dielectrics and/or combinations thereof, and may be formed by using a deposition process such as CVD, PVD, ALD, combinations thereof, or the like.

The third dielectric layer 340 is formed covering the second dielectric layer 330. Similarly, the second dielectric layer 330 and the third dielectric layer 340 may be formed including a dielectric material such as, but not limited to, silicon oxide, silicon nitride, silicon oxynitride, silicon oxycarbide, high-k dielectrics and/or combinations thereof, and may be formed by using a deposition process such as CVD, PVD, ALD, combinations thereof, or the like.

Figure 4C:
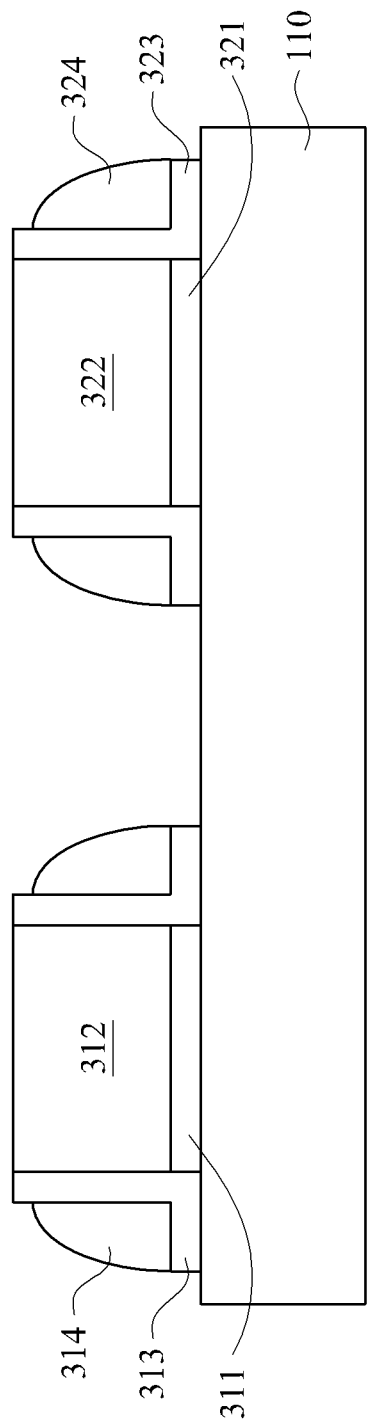

In FIG. 4C, the second dielectric layer 330 and the third dielectric layer 340 are etched back by using an etching process to remove unwanted parts of the second dielectric layer 330 and the third dielectric layer 340, leaving a dielectric layer 313 on sidewalls of the gate dielectric 311 and the gate structure 312, a dielectric layer 323 on sidewalls of the gate dielectric 321 and the gate structure 322, a spacer 314 on outer sidewalls of the dielectric layer 313 and a spacer 324 on outer sidewalls of the dielectric layer 323. In some embodiments, the etching process is an anisotropic etching process, which may include wet etching, dry etching, reactive ion etching, plasma etching or other suitable etching processes.

Figure 4D:
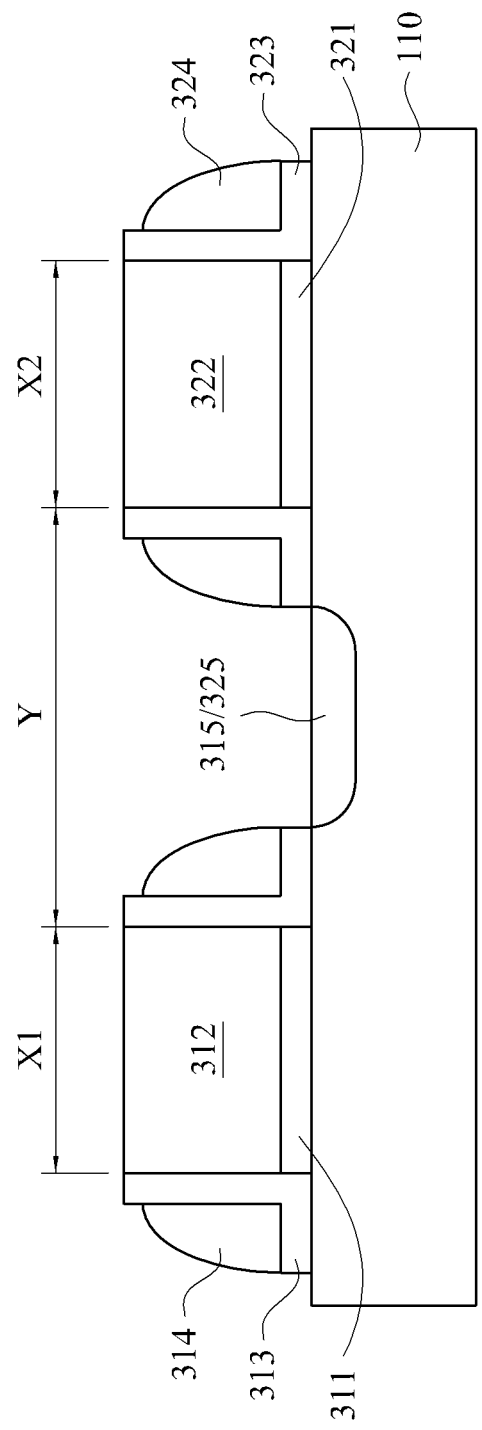

In FIG. 4D, source/drain regions 315 and 325 are formed in the semiconductor substrate 110 by using an implantation process. The implantation process may include an ion implantation process or a diffusion process. The conductivity type of the source/drain regions 315 and 325 may be either P-typed or N-typed.

For the semiconductor structure illustrated in FIG. 4D, because the distance Y between the gate structures 312 and 322 is greater than the width X1 of the gate structure 312 and the width X2 of the gate structure 322, unbalanced mechanical stress generated by the etching process performed on the second dielectric layer 330 and the third dielectric layer 340 or by the subsequent processes can be reduced, the subsequent processes may include such as deposition, etching and/or chemical mechanical polishing (CMP) processes used for contact etch stop layer (CESL) formation, inter-layer dielectric (ILD) layer formation, undoped silicate glass (USG) film formation, contact hole formation and/or contact plug formation above the gate structure 312 and 322 and the source/drain region 315 and 325, such that leakage currents from the transistor 310 to the transistor 320 or from the transistor 320 to the transistor 310 can be prevented.

Figure 5:
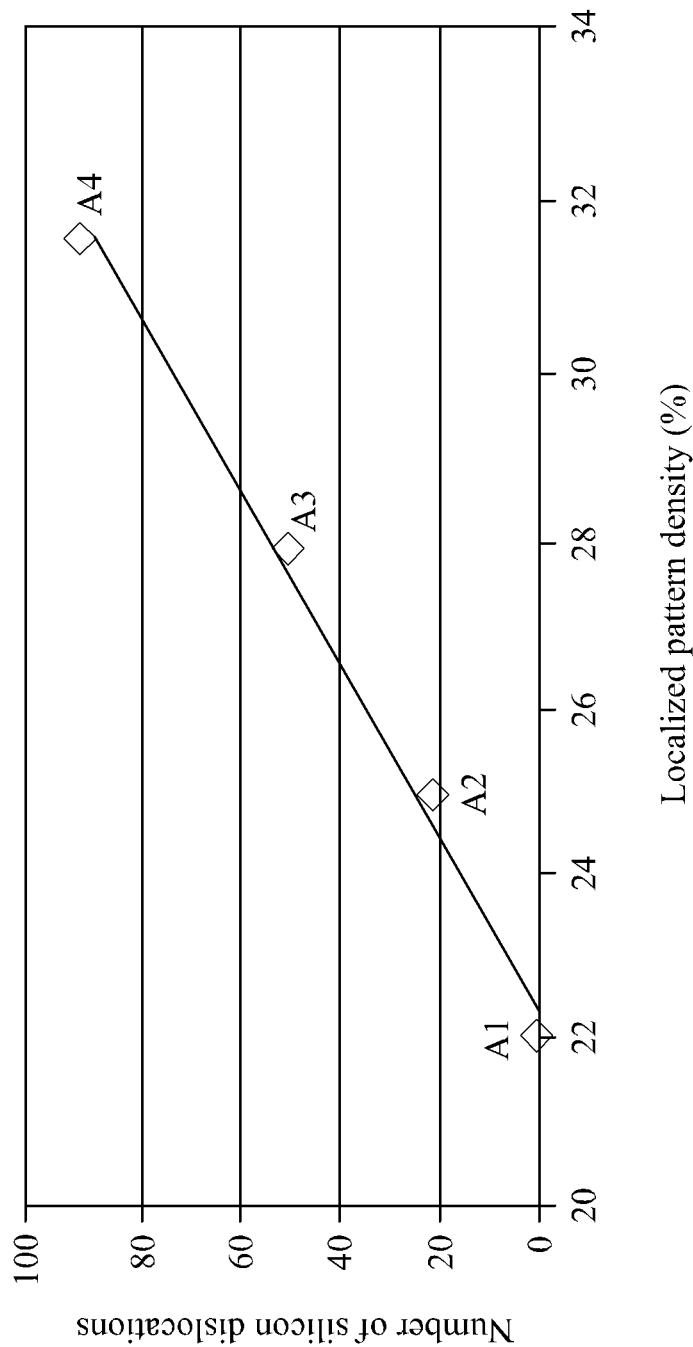
FIG. 5 is a graph illustrating the silicon dislocations versus the localized pattern density.

Referring FIG. 1, FIG. 3 and FIG. 5, FIG. 5 is a graph illustrating the number of silicon dislocations versus the localized pattern density in each of the pixel units 102A of the image sensor device 100. The localized pattern density represents the total area of the transistors (including the transfer transistor 220, the reset transistor 230, the source follower transistor 240 and the row select transistor 250) in each of the pixel units 102A, and the localized pattern density decreases as the distance Y between the source follower transistor 240 and the row select transistor 250 increases. In FIG. 5, four points A1, A2, A3 and A4 are illustrated, and the distance Y of the point A1 is greatest among the points A1, A2, A3 and A4. All of the points A1, A2, A3 and A4 comply with the aforementioned embodiments in which the distance between the source follower transistor 240 and the row select transistor 250 is greater than the width of the gate structure of the source follower transistor 240 and the width of the gate structure of the row select transistor 250. As can be seen from FIG. 5, the number of silicon dislocations of each of the points A1, A2, A3 and A4 is fewer than 100, and the number of silicon dislocations decreases as the localized pattern density decreases. Therefore, leakage currents of the image sensor device 100 due to silicon dislocations can be prevented, and therefore, white pixel performance of the image sensor device 100 is improved.

In addition, in FIG. 5, the linearity of the silicon dislocations and the R-squared value is 0.9905, which indicates there is a nearly perfect linear relationship between the localized pattern density and the number of the silicon dislocation.

Figure 6:
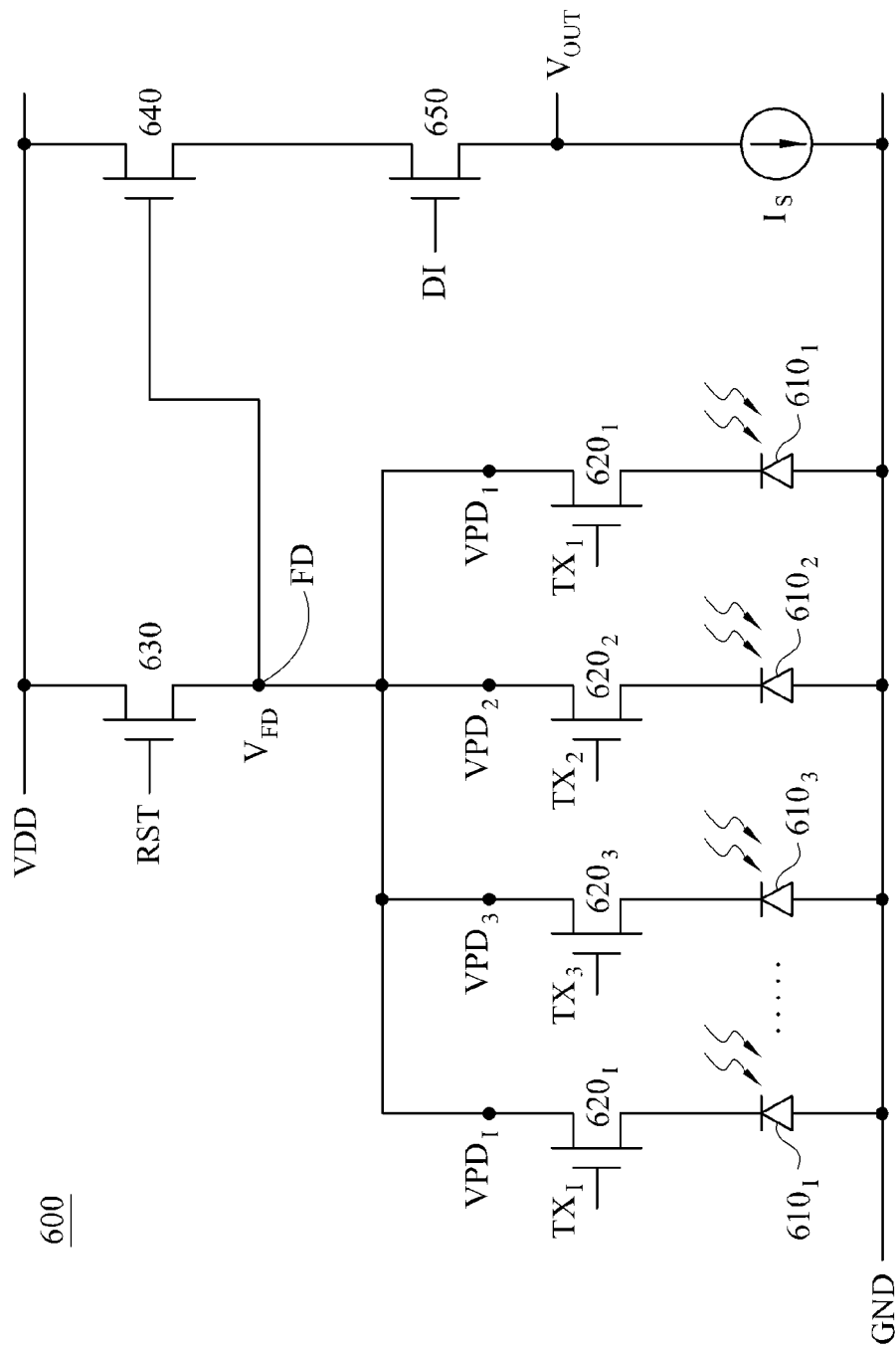
FIG. 6 illustrates another circuit diagram of a pixel circuit of each pixel unit shown in FIG. 1 in accordance with some embodiments of the present disclosure.

The semiconductor structure 300 is also applicable for an image sensor device in which each pixel unit has multiple light sensing elements. Referring to FIG. 6, FIG. 6 illustrates a circuit diagram of a pixel circuit 600 of each pixel unit 102A shown in FIG. 1. In FIG. 6, the pixel circuit 600 includes light sensing elements $610_1$-$610_1$, transfer transistors $620_1$-$620_1$, a reset transistor 630, a source follower transistor 640, a row select transistor 650 and a current source $I_S$. The light sensing elements $610_1$-$610_1$ are adapted to perform photoelectric conversion for converting the incident light into electric charges and provide photon diffusion voltages $VPD_1$-$VPD_1$ to the transfer transistors $620_1$-$620_1$ respectively. The anodes of the light sensing elements $610_1$-$610_1$ are coupled to a ground potential GND. The cathodes of the light sensing elements $610_1$-$610_1$ are coupled to the sources of the transfer transistors $620_1$-$620_1$, respectively. For illustration, the anode and the cathode of the light sensing element $610_1$ are coupled to a ground potential GND and the source of the transfer transistor $620_1$ respectively, the anode and the cathode of the light sensing element $610_2$ are coupled to the ground potential GND and the source of the transfer transistor $620_2$ respectively, the anode and the cathode of the light sensing element $610_3$ are coupled to the ground potential GND and the source of the transfer transistor $620_3$ respectively, and so on.

In some embodiments, the light sensing elements $610_1$-$610_1$ are photodiodes, pinned photodiodes, partially pinned photodiodes, photogates, photo transistors, or combinations thereof.

The transfer transistors $620_1$-$620_1$ are adapted to transfer the photon-induced electric charges in accordance with transfer voltages $TX_1$-$TX_1$. The sources of the transfer transistors $620_1$-$620_1$ are coupled to the light sensing elements $610_1$-$610_1$ respectively. The gates of the transfer transistors $620_1$-$620_1$ are configured to receive the transfer voltages $TX_1$-$TX_1$ respectively. The drains of the transfer transistors $620_1$-$620_1$ are coupled to the source of the reset transistor 630 and the gate of the source follower transistor 640. The connection of the transfer transistors $620_1$-$620_1$ acts as a floating diffusion region FD that accumulates the electric charges generated in the light sensing elements $610_1$-$610_1$.

The reset transistor 630 is adapted to reset the light sensing elements $610_1$-$610_1$ by resetting a floating diffusion voltage $V_{FD}$ in the floating diffusion region FD in accordance with a reset voltage RST. The source of the reset transistor 630 is coupled to the drains of the transfer transistors $620_1$-$620_1$ and the gate of the source follower transistor 640. The gate of the reset transistor 630 is configured to receive the reset voltage RST. The drain of the reset transistor 630 is configured to receive a voltage source VDD.

The source follower transistor 640 is adapted to allow the photon diffusion voltages $VPD_1$-$VPD_1$ to be observed without removing the accumulated electric charge in accordance with the floating diffusion voltage $V_{FD}$. The source of the source follower transistor 640 is coupled to the drain of the row select transistor 650. The gate of the source follower transistor 640 is coupled to the drains of the transfer transistors $620_1$-$620_1$ and the source of the reset transistor 630. The drain of the source follower transistor 640 is configured to receive the voltage source VDD.

The row select transistor 650 is adapted to allow a single row of pixel units in an array, such as illustrated in the array of FIG. 1, to be read in accordance with a row select voltage DI. The source of the row select transistor 650 is coupled to the current source $I_S$ and determines an output voltage $V_{OUT}$. The gate of the row select transistor 650 is configured to receive the row select voltage DI. The drain of the row select transistor 650 is coupled to the source of the source follower transistor 640.

It is noted that, the semiconductor structure 300, in which the distance Y between the gate structures 312 and 322 greater than the width X1 of the gate structure 312 and the width X2 of the gate structure 322, may be applied to other types of image sensor devices, such as charge coupled device (CCD) image sensors and three-dimensional (3D) stacked CMOS image sensors (CISs).

In accordance with some embodiments, the present disclosure discloses an image sensor device. The image sensor device includes pixel units. Each of the pixels includes a light sensing element, a first transistor and a second transistor. The first transistor is coupled to the light sensing element. The second transistor is coupled to the light sensing element and the first transistor. The first transistor includes a first gate structure having a first width, and the second transistor includes a second gate structure having a second width, in which a first distance between the first gate structure and the second gate structure is substantially greater than the first width and the second width.

In accordance with some embodiments, the present disclosure discloses another image sensor device. The image sensor device includes pixel units. Each of the pixel units includes light sensing elements, a first transistor and a second transistor. The first transistor is coupled to the light sensing elements. The second transistor is coupled to the light sensing elements and the first transistor. The first transistor includes a first gate structure having a first width, and the second transistor includes a second gate structure having a second width, in which a first distance between the first gate structure and the second gate structure is substantially greater than the first width and the second width.

In accordance with some embodiments, the present disclosure discloses a semiconductor structure. The semiconductor structure includes a light sensing element, a first transistor and a second transistor. The first transistor is coupled to the light sensing element. The second transistor is coupled to the light sensing element and the first transistor. The first transistor includes a first gate structure having a first width, and the second transistor includes a second gate structure having a second width, in which a distance between the first gate structure and the second gate structure is substantially greater than the first width and the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
   a plurality of pixel units, each of the pixel units comprising:
      a light sensing element;
      a source follower transistor coupled to the light sensing element; and
      a row select transistor coupled to the light sensing element and the source follower transistor;

wherein the source follower transistor comprises a first gate structure having a first width, and the row select transistor comprises a second gate structure having a second width, wherein a first distance between the first gate structure and the second gate structure is substantially greater than the first width and the second width.

2. The image sensor device of claim 1, wherein each of the pixel units further comprises:
   a reset transistor coupled to the light sensing element and the source follower transistor; and
   a transfer transistor coupled to the light sensing element and the reset transistor.

3. The image sensor device of claim 2, wherein, in each of the pixel units, the reset transistor comprises a third gate structure having a third width, and the transfer transistor comprises a fourth gate structure having a fourth width, wherein a second distance between the first gate structure and the third gate structure is substantially greater than the first width and the third width, a third distance between the first gate structure and the fourth gate structure is substantially greater than the first width and the fourth width, a fourth distance between the second gate structure and the third gate structure is substantially greater than the second width and the third width, a fifth distance between the second gate structure and the fourth gate structure is substantially greater than the second width and the fourth width, and a sixth distance between the third gate structure and the fourth gate structure is substantially greater than the third width and the fourth width.

4. The image sensor device of claim 1, wherein the plurality of pixel units are complementary metal-oxide semiconductor (CMOS) pixel units.

5. The image sensor device of claim 4, wherein the image sensor device is a three-dimensional (3D) stacked CMOS image sensor (CIS).

6. The image sensor device of claim 1, wherein the plurality of pixel units are charge coupled device (CCD) pixel units.

7. The image sensor device of claim 1, wherein the light sensing element of each of the pixel units is a photodiode.

8. An image sensor device, comprising:
   a plurality of pixel units, each of the pixel units comprising:
      a plurality of light sensing elements;
      a source follower transistor coupled to the plurality of light sensing elements; and
      a row select transistor coupled to the plurality of light sensing elements and the source follower transistor;
      wherein the source follower transistor comprises a first gate structure having a first width, and the row select transistor comprises a second gate structure having a second width, wherein a first distance between the first gate structure and the second gate structure is substantially greater than the first width and the second width.

9. The image sensor device of claim 8, wherein each of the pixel units further comprises:
   a reset transistor coupled to the light sensing element and the source follower transistor; and
   a plurality of transfer transistors coupled to the light sensing element and the reset transistor, wherein the transfer transistors correspond to the light sensing elements respectively.

10. The image sensor device of claim 9, wherein, in each of the pixel units, the reset transistor comprises a third gate structure having a third width, and each of the transfer transistors comprises a fourth gate structure having a fourth width, wherein a second distance between the first gate structure and the third gate structure is substantially greater than the first width and the third width, a third distance between the first gate structure and each of the fourth gate structures is substantially greater than the first width and the fourth width, a fourth distance between the second gate structure and the third gate structure is substantially greater than the second width and the third width, a fifth distance between the second gate structure and each of the fourth gate structures is substantially greater than the second width and the fourth width, and a sixth distance between the third gate structure and each of the fourth gate structures is substantially greater than the third width and the fourth width.

11. The image sensor device of claim 8, wherein the plurality of pixel units are CMOS pixel units.

12. The image sensor device of claim 11, wherein the image sensor device is a 3D stacked CIS.

13. The image sensor device of claim 8, wherein the plurality of pixel units are CCD pixel units.

14. The image sensor device of claim 8, wherein the light sensing elements of each of the pixel units are photodiodes.

15. A semiconductor structure, comprising:
   a light sensing element;
   a source follower transistor coupled to the light sensing element; and
   a row select transistor coupled to the light sensing element and the source follower transistor;
   wherein the source follower transistor comprises a first gate structure having a first width, and the row select transistor comprises a second gate structure having a second width, wherein a distance between the first gate structure and the second gate structure is substantially greater than the first width and the second width.

16. The semiconductor structure of claim 15, wherein the light sensing element is a photodiode.

* * * * *